United States Patent
Cho et al.

(10) Patent No.: US 7,999,264 B2
(45) Date of Patent: Aug. 16, 2011

(54) THIN FILM TRANSISTOR ARRAY PANEL AND DISPLAY DEVICE

(75) Inventors: Jong-Whan Cho, Gunpo-si (KR); Jeong-Geun Yoo, Yongin-si (KR); Byung-Woong Han, Incheon-si (KR)

(73) Assignee: Samsung Electronics Co., Ltd. (KR)

( * ) Notice: Subject to any disclaimer, the term of this patent is extended or adjusted under 35 U.S.C. 154(b) by 1070 days.

(21) Appl. No.: 11/669,583

(22) Filed: Jan. 31, 2007

(65) Prior Publication Data

US 2007/0194320 A1 Aug. 23, 2007

(30) Foreign Application Priority Data

Feb. 17, 2006 (KR) .................. 10-2006-0015481

(51) Int. Cl.
*H01L 27/14* (2006.01)
*H01L 21/20* (2006.01)

(52) U.S. Cl. ........... 257/72; 257/E27.111; 257/E21.411; 438/479

(58) Field of Classification Search .............. 257/49, 257/66, 72, 213, 288, 347–354, E27.001, 257/E27.009, E27.111, E27.112, E27.113, 257/E21.4, E21.409, E21.411, E21.415, E21.416; 345/156, 173–178; 438/478–509
See application file for complete search history.

(56) References Cited

U.S. PATENT DOCUMENTS

| 5,847,690 | A | 12/1998 | Boie et al. |
| 6,876,355 | B1 | 4/2005 | Ahn et al. |
| 2006/0109222 | A1* | 5/2006 | Lee et al. ............... 345/88 |

FOREIGN PATENT DOCUMENTS

| JP | 2001-042296 | 2/2001 |
| JP | 2002-149346 | 5/2002 |
| JP | 2003-066463 | 3/2003 |
| JP | 2003-195317 | 7/2003 |
| KR | 1020030019666 | 3/2003 |
| KR | 1020040022354 | 3/2004 |
| KR | 1020040056746 | 7/2004 |
| KR | 1020040076415 | 9/2004 |

* cited by examiner

*Primary Examiner* — Minh-Loan T Tran
*Assistant Examiner* — Kevin Quinto
(74) *Attorney, Agent, or Firm* — Cantor Colburn LLP

(57) ABSTRACT

A display device includes a first display panel including a common electrode disposed thereon, and a second display panel including; thin film transistors ("TFTs") each including a gate electrode, a source electrode, and a drain electrode, a first passivation layer disposed on the source and drain electrodes, a second passivation layer disposed on the first passivation layer and including at least one sensing protrusion, pixel electrodes disposed on the second passivation layer and connected with the drain electrode, and at least one conductive member disposed on the sensing protrusion.

32 Claims, 9 Drawing Sheets

THIN FILM TRANSISTOR ARRAY PANEL AND DISPLAY DEVICE

This application claims priority to Korean Patent Application No. 10-2006-0015481, filed on Feb. 17, 2006, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor array panel and a display device.

(b) Description of the Related Art

Liquid crystal displays ("LCDs"), which are one type of flat panel display devices, include two panels, one with pixel electrodes formed thereon and one with a common electrode formed thereon, and a liquid crystal layer with dielectric anisotropy interposed between the two panels. The pixel electrodes are arranged substantially in a matrix and are connected with switching elements such as thin film transistors ("TFTs") to receive an image data voltage sequentially row by row. The area formed by each pixel electrode is referred to as a pixel, and an LCD may include a plurality of pixels. The common electrode is formed on the entire surface of one of two panels and receives a common voltage. A pixel electrode, the corresponding portion of the common electrode, and corresponding portion of the liquid crystal layer interposed therebetween form a liquid crystal capacitor in terms of circuitry, and the liquid crystal capacitor is a basic element of a pixel together with the switching element connected thereto.

In the LCD, a voltage is applied to the two electrodes to generate an electric field in the liquid crystal layer, and transmittance of light which passes through the liquid crystal layer is controlled by varying the strength of the electric field to thus obtain a desired degree of light transmittance. The degree of light transmittance may be nearly simultaneously controlled in the plurality of pixels to generate an image.

Touch screen panels are input devices for enabling a user to interact with a machine such as a computer by writing or drawing characters or figures using a finger or a pen on a screen in a contact manner. The interaction may also be by using a finger or pen to press an on-screen button or icon to instruct the computer to perform an action. LCDs including the touch screen panels can recognize whether the finger of the user or the touch pen contacts on the screen and can also obtain contact position information of the contact.

However, the LCD including the touch screen panel has problems in that the installation of the touch screen panel increases a unit cost, an additional process of attaching the touch screen panel on a liquid crystal panel assembly reduces production yield, luminance of the LCD deteriorates, and a thickness of the product increases.

BRIEF SUMMARY OF THE INVENTION

Therefore, the present invention has been made in an effort to provide a display device having a sensing unit having advantages of accurately sensing contact and a contact position.

The present invention has also been made in an effort to improve durability of a sensing unit.

An exemplary embodiment of a thin film transistor (TFT) array panel includes: a plurality of thin film transistors disposed on a substrate each thin film transistor including a gate electrode, a source electrode, and a drain electrode, a first passivation layer disposed on the source and drain electrodes, and including a first contact hole exposing at least a portion of the drain electrode, a second passivation layer disposed on the first passivation layer, and including at least one sensing protrusion and a second contact hole, pixel electrodes disposed on the second passivation layer connected with a drain electrode through the first and second contact holes, and at least one conductive member disposed on the sensing protrusion.

Another exemplary embodiment of a TFT array panel includes; a plurality of TFTs disposed on a substrate and each including a gate electrode, a source electrode, and a drain electrode, a first passivation layer disposed on the source and drain electrodes, and having a first contact hole exposing at least a portion of the drain electrode, pixel electrodes disposed on the first passivation layer and connected with a drain electrode through the first contact hole, at least one conductive member disposed on the first passivation layer, and at least one sensing protrusion disposed on the conductive member.

The exemplary embodiment of a TFT array panel may further include a second passivation layer disposed on the first passivation layer and including a second contact hole corresponding to the first contact hole.

In one exemplary embodiment the conductive member may include substantially the same material as the pixel electrode.

In one exemplary embodiment the conductive member may include indium tin oxide ("ITO"), indium zinc oxide ("IZO"), or a transparent conductive organic film.

In one exemplary embodiment the conductive member may be disposed on the same layer on which the pixel electrode is disposed.

In one exemplary embodiment the second passivation layer may include an organic insulator.

In one exemplary embodiment the TFT array panel may further include color filters disposed on the first passivation layer.

Another exemplary embodiment of a display device according to the present invention includes; a first display panel including a common electrode disposed thereon, and a second display panel including; a plurality of TFTs each including a gate electrode, a source electrode, and a drain electrode, a first passivation layer disposed on the source and drain electrodes, a second passivation layer disposed on the first passivation layer and including at least one sensing protrusion, pixel electrodes disposed on the second passivation layer and connected with the drain electrode, and at least one conductive member disposed on the sensing protrusion.

Still another exemplary embodiment of a display device includes; a first display panel including a common electrode disposed thereon, and a second display panel including; a plurality of TFTs each including a gate electrode, a source electrode, and a drain electrode, a first passivation layer disposed on the source and drain electrodes, pixel electrodes disposed on the first passivation layer and connected with the drain electrode, at least one conductive member disposed on the first passivation layer, and at least one sensing protrusion disposed on the conductive member.

In one exemplary embodiment the display device may further include a second passivation layer disposed on the first passivation layer.

The conductive member may include the same material as the pixel electrode, and may include a transparent conductive organic film.

The conductive member may be disposed on the same layer on which the pixel electrode is formed.

The second passivation layer may include an organic insulator.

The sensing protrusion may include a transparent conductive organic film.

The first display panel may further include spacers disposed on the common electrode.

A height of the sensing protrusion may be lower than a height of the spacers.

The second display panel may further include color filters disposed on the first passivation layer.

An exemplary embodiment of a method of manufacturing a thin film transistor array panel includes; disposing a plurality of thin film transistors on a substrate, each thin film transistor including a gate electrode, a source electrode, and a drain electrode, disposing a first passivation layer on the source and drain electrodes, wherein the first passivation layer includes a first contact hole exposing at least a portion of the drain electrode, disposing a second passivation layer on the first passivation layer, wherein the second passivation layer includes at least one sensing protrusion and a second contact hole, disposing pixel electrodes on the second passivation layer, wherein the pixel electrodes are connected with the drain electrode through the first and second contact holes; and disposing at least one conductive member on the sensing protrusion.

BRIEF DESCRIPTION OF THE DRAWINGS

The foregoing and other aspects, features, and advantages of the present invention will become more apparent from the following detailed description of the present invention when taken in conjunction with the accompanying drawings.

DETAILED DESCRIPTION OF THE INVENTION

Figure 1:
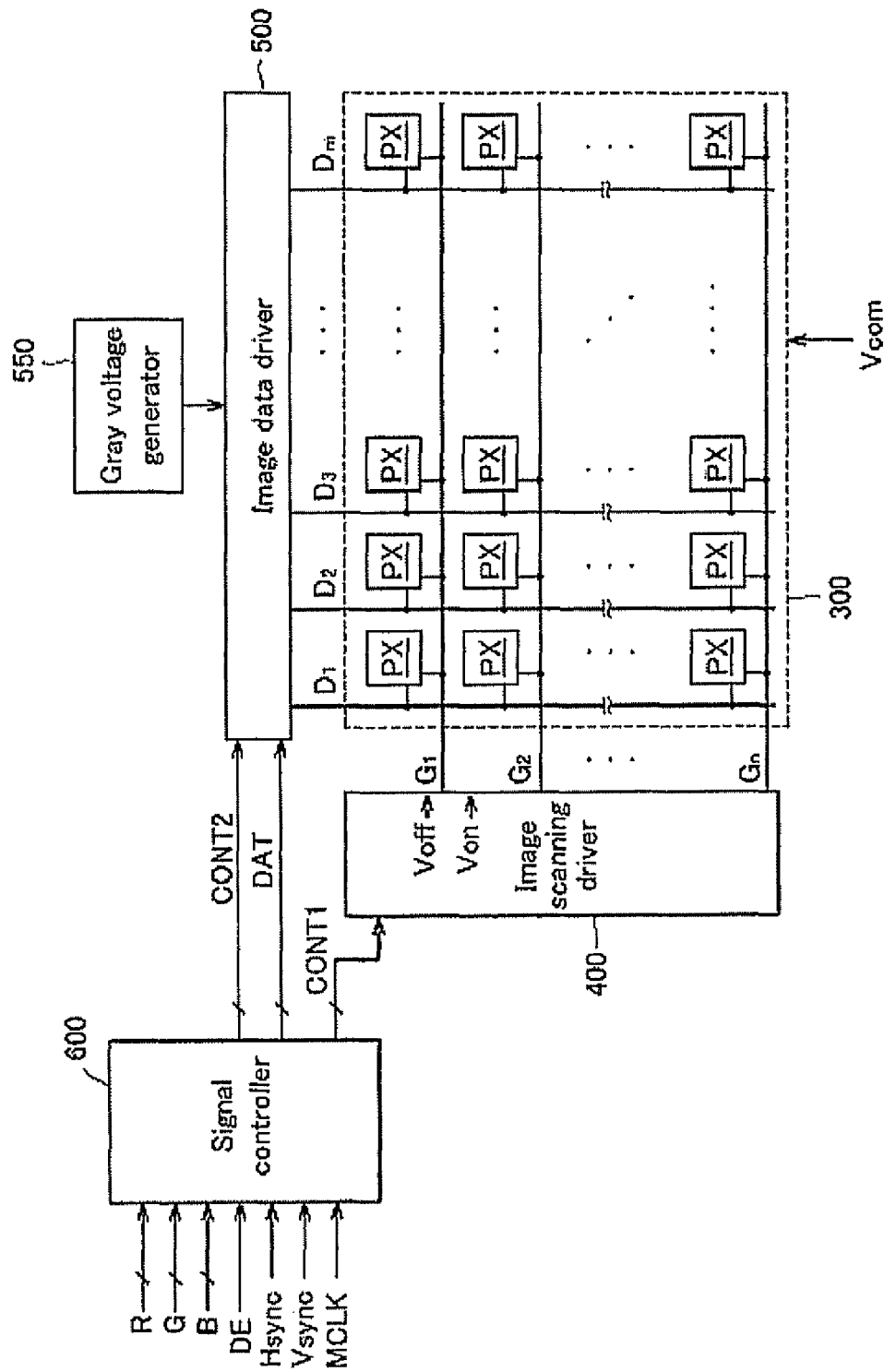
FIG. 1 is a schematic block diagram of an exemplary embodiment of a liquid crystal display ("LCD") according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. [The above paragraph may be replaced with the following] Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

An exemplary embodiment of a liquid crystal display ("LCD") according to the present invention, will now be described in detail with reference to the accompanying drawings.

Figure 2:
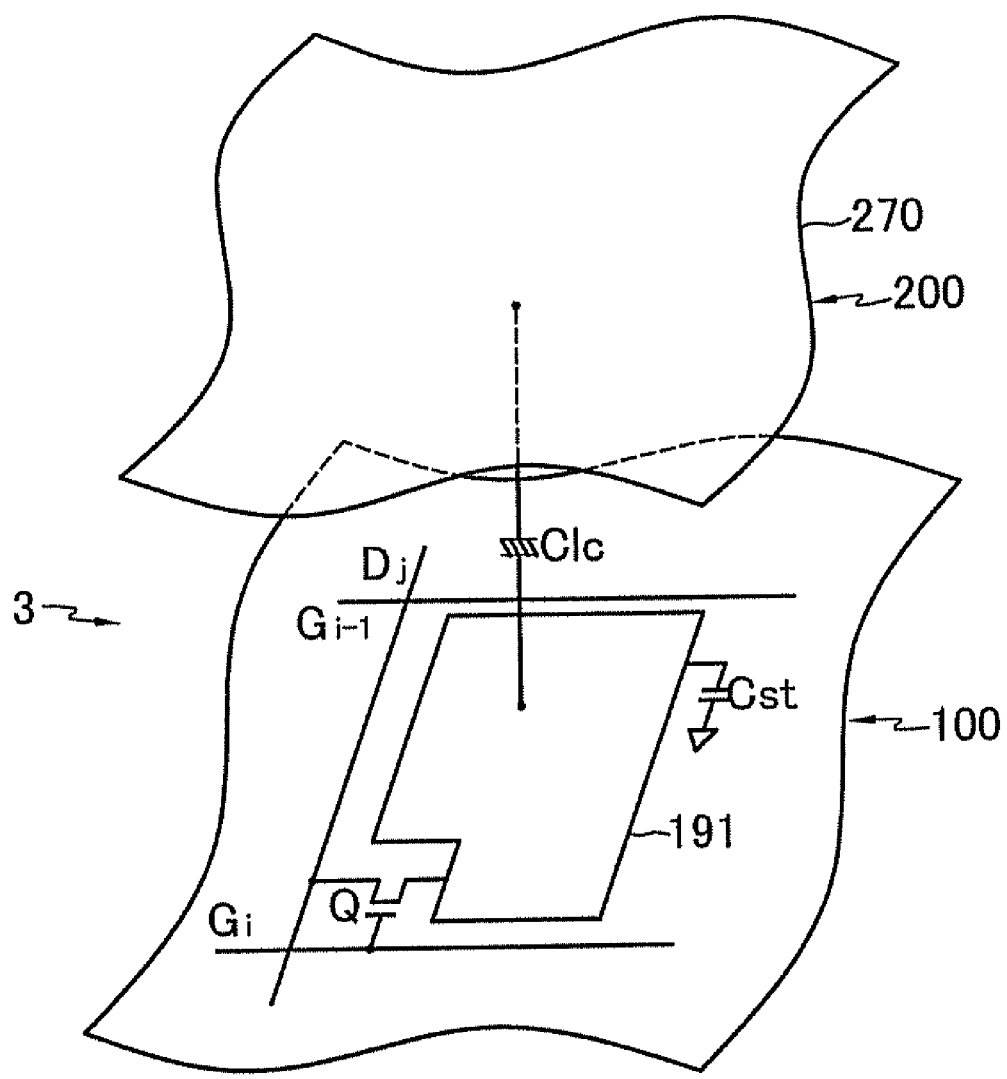
FIG. 2 is an equivalent circuit diagram of an exemplary embodiment of one pixel of an exemplary embodiment of an LCD according to the present invention.

FIG. 1 is a schematic block diagram of an exemplary embodiment of an LCD according to the present invention, and FIG. 2 is an equivalent circuit diagram of an exemplary embodiment of one pixel of an exemplary embodiment of an LCD according to the present invention.

Figure 3:
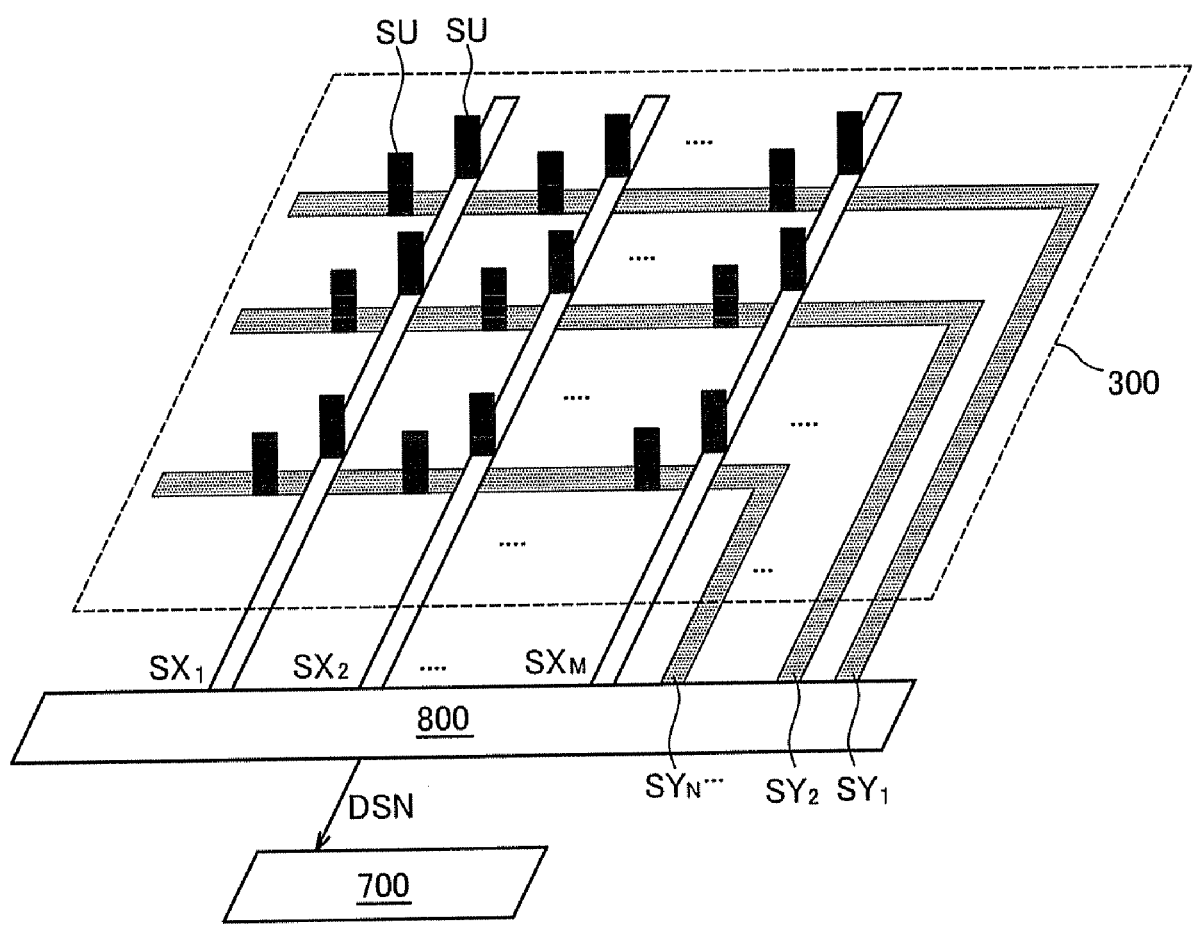
FIG. 3 is a schematic block diagram of an exemplary embodiment of an LCD according to the present invention.
Figure 4:
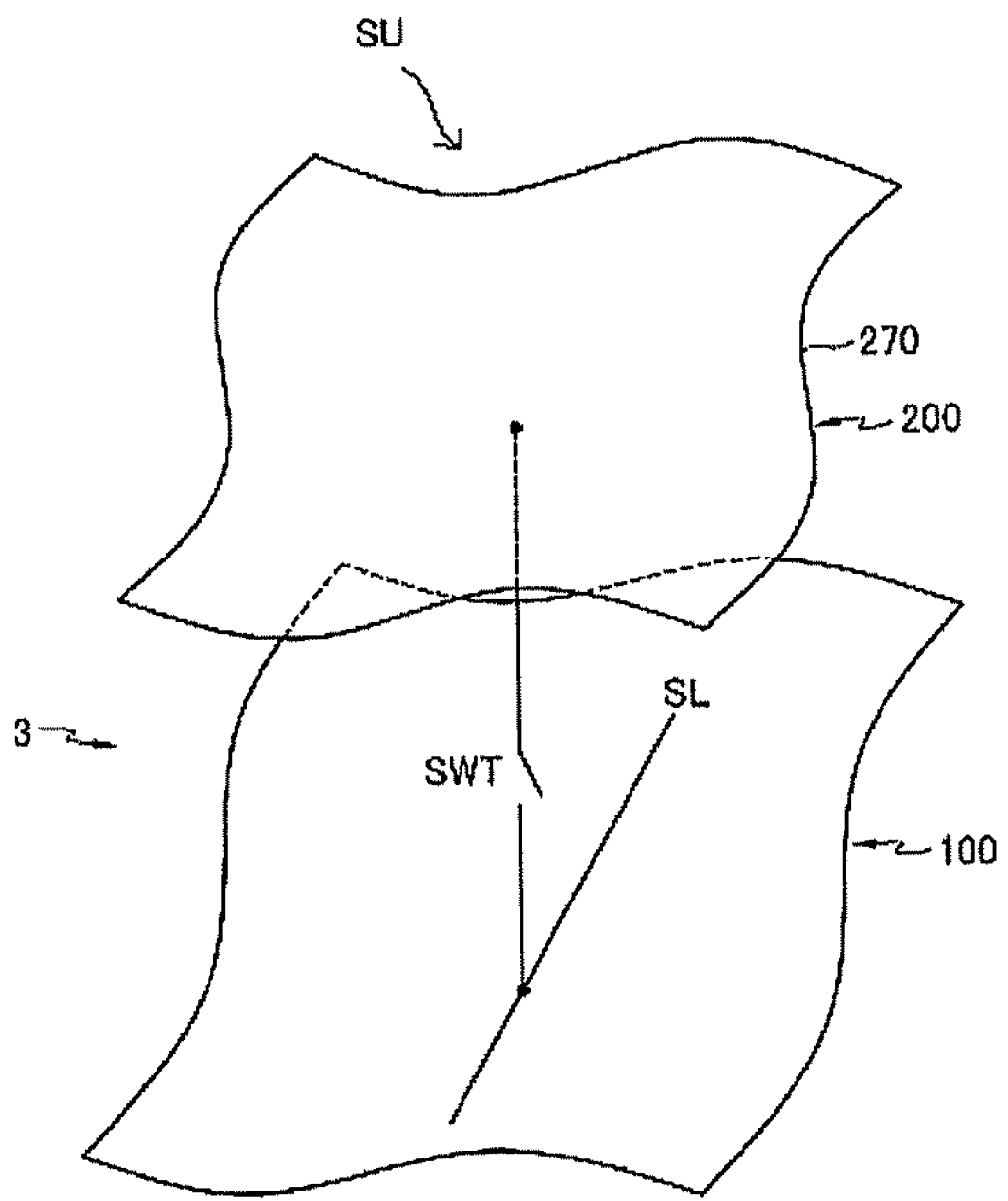
FIG. 4 is an equivalent circuit diagram of an exemplary embodiment of one sensing unit according to the present invention.
Figure 5:
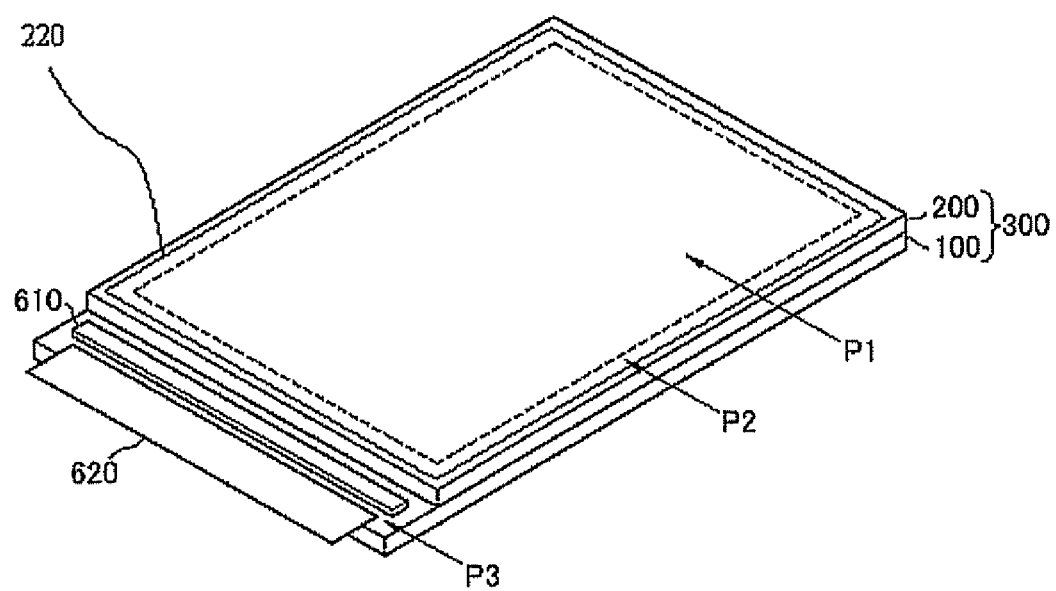
FIG. 5 is a schematic diagram of an exemplary embodiment of an LCD according to the present invention.

FIG. 3 is a schematic block diagram of an exemplary embodiment of an LCD according to the present invention, FIG. 4 is an equivalent circuit diagram of an exemplary embodiment of one sensing unit according to the present invention, and FIG. 5 is a schematic diagram of an exemplary embodiment of an LCD according to the present invention.

Referring to FIGS. 1 and 3, the exemplary embodiment of an LCD according to the present invention includes a liquid crystal panel assembly 300, an image scanning driver 400, an image data driver 500, and a sense signal processor 800 connected with the liquid crystal panel assembly 300, a gray voltage generator 550 connected with the image data driver 500, a contact determiner 700 connected with the sense signal processor 800, and a signal controller 600 for controlling the abovementioned components.

Referring to FIGS. 1 to 4, the liquid crystal panel assembly 300 includes a plurality of display signal lines $G_1$-$G_n$ and $D_1$-$D_m$, a plurality of pixels PX connected with the display signal lines $G_1$-$G_n$ and $D_1$-$D_m$ and arranged substantially in a matrix shape, a plurality of sense signal lines $SY_1$-$SY_N$ and $SX_1$-$SX_M$, and a plurality of sensing units SU connected with the sense signal lines $SY_1$-$SY_N$ and $SX_1$-$SX_M$ and arranged substantially in a matrix shape. Referring to FIGS. 2 and 5, the liquid crystal panel assembly 300 includes a thin film transistor ("TFT") array panel 100 and a common electrode panel 200 which face each other, a liquid crystal layer 3 interposed therebetween, and spacers (not shown) which maintain a gap between the two panels 100 and 200 and which may be deformed to some extent by compression.

The signal lines $G_1$-$G_n$ and $D_1$-$D_m$ include a plurality of image scanning lines $G_1$-$G_n$ for transferring image scanning signals and a plurality of image data lines $D_1$-$D_m$ for transferring image data voltages, and the sense signal lines $SY_1$-$SY_N$ and $SX_1$-$SX_M$ include a plurality of horizontal sense data lines $SY_1$-$SY_N$ and a plurality of vertical sense data lines $SX_1$-$SX_M$ for transferring sense data signals.

In one exemplary embodiment the image scanning lines $G_1$-$G_n$ and the horizontal sense data lines $SY_1$-$SY_N$ extend substantially in a row direction and are substantially parallel to each other, and the image data lines $D_1$-$D_m$ and the vertical sense data lines $SX_1$-$SX_M$ extend substantially in a column direction and are substantially parallel to each other.

Each pixel PX includes a switching element Q which is connected to, an i-th (i=1, 2, ..., n) image scanning line $G_i$ and a j-th (j=1, 2, ..., m) image data line $D_j$, a liquid crystal capacitor Clc, and a storage capacitor Cst connected thereto. In alternative exemplary embodiments the storage capacitor Cst may be omitted.

In one exemplary embodiment the switching element Q is a three-terminal element such as the TFT provided on the TFT array panel 100, and includes a control terminal connected to the image scanning line $G_j$, an input terminal connected to the data line $D_j$, and an output terminal connected to the liquid crystal capacitor Clc and the storage capacitor Cst. In such an exemplary embodiment, the TFT includes amorphous silicon or polycrystalline silicon.

The liquid crystal capacitor Clc includes a pixel electrode 191 of the TFT array panel 100 and a common electrode 270 of the common electrode panel 200 as two terminals thereof, and the liquid crystal layer 3 between the two electrodes 191 and 270 serves as a dielectric material for the liquid crystal capacitor Clc. The pixel electrode 191 is connected to the switching element Q, and the common electrode 270 is formed on substantially the entire surface of the common electrode panel 200 and receives a common voltage Vcom. In an alternative exemplary embodiment, the common electrode 270 may be provided on the TFT array panel 100, and at least one of the two electrodes 191 and 270 may be formed in a linear or bar shape.

The storage capacitor Cst serves as an auxiliary to the liquid crystal capacitor Clc and is formed as a signal line (not shown) separately provided on the TFT array panel 100. In one exemplary embodiment the storage capacitor is formed overlapping the pixel electrode 191 with an insulator interposed therebetween. The storage capacitor Cst is supplied with a predetermined voltage such as the common voltage Vcom or the like. Also, in one exemplary embodiment the storage capacitor Cst may be formed in the region where the pixel electrode 191 overlaps the immediately previous image scanning line.

In order to display separate colors, each pixel PX inherently displays one of a set of primary colors (spatial division) or sequentially display the primary colors (temporal division), so that a desired color may be recognized by a spatial or temporal sum of the primary colors. An exemplary embodiment of a set of the primary colors may include of red, green, and blue. FIG. 2 shows an exemplary embodiment of the spatial division in which a color filter (not shown) for displaying one of the primary colors may be formed above or below the pixel electrode 191 of the TFT array panel 100. In an alternative exemplary embodiment each pixel PX may have a color filter at a region of the common electrode panel 200 corresponding to the pixel electrode 191.

At least one polarizer (not shown) is attached on an outer surface of the liquid crystal panel assembly 300.

The sensing unit SU may have a structure as shown in FIG. 4. The sensing unit SU as shown in FIG. 4, is an exemplary embodiment of a pressure sensing unit which includes a switch SWT connected with at least one of the horizontal or vertical sense data lines $SY_1$-$SY_N$ or $SX_1$-$SX_M$ (referred to hereinafter as "a sense data line" and indicated as SL), respectively.

The switch SWT has the common electrode 270 of the common electrode panel 200 and the sense data line SL of the TFT array panel 100 as two terminals thereof, and at least one of the two terminals projects towards the other, the two terminals may be physically and electrically connected according to a user forcing contact therebetween. Accordingly, the common voltage Vcom from the common electrode 270 is outputted as a sense data signal to the sense data line SL.

The structure and operation of the pressure sensing unit will now be described in detail.

By analyzing a sense data signal flowing through the horizontal sense data lines $SY_1$-$SY_N$, the Y coordinate of a contact point may be determined, and by analyzing a sense data signal flowing through the vertical sense data lines $SX_1$-$SX_M$, the X coordinate of the contact point may be determined.

The pressure sensing unit SU is disposed between adjacent pixels PX. In one exemplary embodiment the plurality of pressure sensing units SU may be disposed so that a density of a pair of sensing units SU connected with the horizontal and vertical sense data lines $SY_1$-$SY_N$ and $SX_1$-$SX_M$ and disposed to be adjacent to their crossing points may be about one-fourths of a dot density wherein one dot includes three pixels PX for displaying the three primary colors such as red, green, and blue which are arranged to display a color. The one dot is a basic unit for indicating resolution of the LCD. In alternative exemplary embodiments the one dot may include four or more pixels PX and, in such an exemplary embodiment, each pixel PX may display one of the three primary colors and a white color.

In one exemplary embodiment, when the density of the pair of sensing units SU is one-fourth of the dot density, horizontal and vertical resolution of the pair of sensing units SU is half of the horizontal and vertical resolution of the LCD. In such an exemplary embodiment, there may be a pixel row or a pixel column which does not have the sensing unit SU.

When the density of the sensing units SU and the dot are set to the degree described above, the LCD is suitable for applications requiring high precision such as character recognition. However, the present invention is not limited to high precision applications and the resolution of the sensing units SU may be higher or lower and still be within the scope of the present invention.

Referring to FIGS. 1 and 3, in one exemplary embodiment the gray voltage generator 550 generates two sets of gray voltages (or reference gray voltages) related to transmittance of the pixels PX. One of the two sets of gray voltages has a positive value and the other has a negative value with respect to the common voltage Vcom. The gray voltages applied to the pixel electrodes 191 change polarity about the common voltage Vcom in order to change the orientation of the twisting force applied to the liquid crystal molecules. When the liquid crystal molecules are twisted in only one direction they may deteriorate more rapidly than if the twisting force is of a varying orientation. Therefore, the application of gray voltages which change polarity with respect to the common voltage Vcom increases the lifetime of the LC panel assembly 300.

The image scanning driver 400 is connected with the image scanning lines $G_1$-$G_n$ of the liquid crystal panel assembly 300 and applies image scanning signals including a combination of a gate-on voltage Von for turning on the switching element Q and a gate-off voltage Voff for turning off the switching element Q substantially sequentially to the image scanning lines $G_1$-$G_n$.

The image data driver 500 is connected with the image data lines $D_1$-$D_m$ of the liquid crystal panel assembly 300, selects a gray voltage from the gray voltage generator 550, and applies it as an image data voltage to the image data lines $D_1$-$D_m$. In the exemplary embodiment wherein the gray voltage generator 550 provides only a predetermined number of reference gray voltages, the image data driver 500 divides the reference gray voltages and thereby generates gray voltages for all gray voltage values and selects an image data voltage therefrom.

The sense signal processor 800 is connected with the sense data lines $SY_1$-$SY_N$ and $SX_1$-$SX_M$ of the liquid crystal panel assembly 300, receives a sense data signal outputted through the sense data lines $SY_1$-$SY_N$ and $SX_1$-$SX_M$, and processes it to generate a digital sense signal DSN.

The contact determiner 700 receives the digital sense signal DSN from the sense signal processor 800 and determines whether the pressure sensing unit SU has been contacted or not and if it has been contacted also determines a contact position thereof. In one exemplary embodiment the contact determiner 700 may be formed as a central processing unit ("CPU").

The signal controller 600 controls operations of the image scanning driver 400, the image data driver 500, the gray voltage generator 550, and the sense signal processor 800.

In one exemplary embodiment the drivers 400, 500, 550, 600, 700, and 800 may be directly mounted in the form of at least one integrated chip ("IC") on the liquid crystal panel assembly 300. In another exemplary embodiment the drivers 400, 500, 550, 600, 700, and 800 may be mounted on a flexible printed circuit film (not shown) which may be attached in the form of a tape carrier package ("TCP") on the liquid crystal panel assembly 300, or may be mounted on a separate printed circuit board ("PCB") (not shown).

In yet another exemplary embodiment the drivers 400, 500, 550, 600, 700, and 800 may be integrated together with the signal lines $G_1$-$G_n$, $D_1$-$D_m$, $SY_1$-$SY_N$, and $SX_1$-$SX_M$ and TFT Q, on the liquid crystal panel assembly 300.

Referring to FIG. 5, the liquid crystal panel assembly 300 is divided into a display region P1, an edge region P2, and an exposed region P3. The pixels PX, the sensing units SU, and the signal lines $G_1$-$G_n$, $D_1$-$D_m$, $SY_1$-$SY_N$, and $SX_1$-$SX_M$ are substantially positioned on the display region P1. The common electrode panel 200 includes a light blocking member 220, and the light blocking member 220 covers most parts of the edge region P2 in order to block external light. Because the common electrode panel 200 is smaller than the TFT array panel 100, a portion of the TFT array panel 100 is exposed to form the exposed region P3. A single chip 610 is mounted on the exposed region P3 and a flexible printed circuit ("FPC") board 620 is attached on the exposed region P3.

In the present exemplary embodiment the single chip 610 includes the drivers, namely, the image scanning driver 400, the image data driver 500, the gray voltage generator 550, the signal controller 600, the contact determiner 700, and the sense signal processor 800, for driving of the LCD. By integrating the drivers 400, 500, 550, 600, 700, and 800 in the single chip 610, their mounting area and power consumption can be reduced. In alternative exemplary embodiments at least one of the drivers or at least one circuit element constituting them may be positioned outside the single chip 610.

The signal lines $G_1$-$G_n$ and $D_1$-$D_m$ and the sense data lines $SY_1$-$SY_N$ and $SX_1$-$SX_M$ extend to the exposed region P3 to connect with the corresponding drivers 400, 500, and 800.

The FPC board 620 receives signals from an external device and transfers them to the single chip 610 or the liquid crystal panel assembly 300, and in order to facilitate a connection with the external device, ends of the FPC board 620 are formed as a connector (not shown).

The displaying and sensing operations of the LCD will be described in detail as follows.

The signal controller 600 receives input image signals R, G, and B and input control signals for controlling display of the input image signals R, G, and B from an external device (not shown). The input image signals R, G, and B include luminance information for each pixel PX, wherein luminance includes a predetermined number of gray levels, e.g., 1024 ($=2^{10}$), 256 ($=2^8$), or 64 ($=2^6$) gray levels. In one exemplary embodiment the input control signals include a vertical synchronization signal Vsync, a horizontal synchronization signal Hsync, a main clock signal MCLK, a data enable signal DE, and various other similar signals.

The signal controller 600 processes the input image signals R, G, and B according to operating conditions of the liquid crystal panel assembly 300 based on the input image signals R, G, and B and the input control signal, then the signal controller 600 generates an image scanning control signal CONT1 and an image data control signals CONT2, and various other image scanning control signals, and transmits the image scanning control signal CONT1 to the image scanning driver 400 and transmits the image data control signal CONT2 and the processed image signals DAT to the image data driver 500.

The image scanning control signal CONT1 includes a scanning start signal STV for instructing starting of scanning and at least one clock signal for controlling an output of the gate-on voltage Von. In one exemplary embodiment the image scan control signal CONT1 may additionally include an output enable signal OE for limiting duration of the gate-on voltage Von.

The image data control signal CONT2 includes a horizontal synchronization start signal STH for informing of starting of transmission of the image signals DAT with respect to one row of pixels PX, a load signal LOAD for indicating application of an image data voltages to the image data lines $D_1$-$D_m$, and a data clock signal HCLK. In one exemplary embodiment the image data control signal CONT2 may additionally include an inversion signal RVS for inverting polarity of a voltage of the image data voltages with respect to the common voltage Vcom (which is called "polarity of image data voltage") as described above.

The image data driver 500 receives the digital image signals DAT with respect to one row of pixels PX according to the image data control signals CONT2 received from the signal controller 600, selects a gray voltage corresponding to each digital image signal DAT to thus convert the digital image signal DAT into an analog data voltage, and applies it to the corresponding image data lines $D_1$-$D_m$.

The image scanning driver 400 applies the gate-on voltage Von to the image scanning lines $G_1$-$G_n$ according to the image scanning control signals CONT1 from the signal controller 600 to turn on the switching elements Q connected with the image scanning lines $G_1$-$G_n$. Then, the image data voltages, which have been applied to the image data lines $D_1$-$D_m$, are applied to the corresponding pixels PX through the turned-on switching elements Q.

A voltage is charged in the pixel PX according to a difference between the voltage of the image data voltage applied to the pixels PX and the common voltage Vcom. This charged voltage is a pixel voltage of the liquid crystal capacitor Clc. Arrangement of liquid crystal molecules is controlled according to the size of the pixel voltage, and polarization of light which is transmitted through the liquid crystal layer 3 is changed accordingly. The change in the polarization appears as a change in transmittance of light due to the polarizer (not shown) attached on the liquid crystal panel assembly 300. A plurality of pixels, each capable of independently controlling the arrangement of liquid crystals therein and thereby also controlling the transmittance of light therethrough, may thereby display a desired image.

This process is repeatedly performed by a unit of one horizontal period (namely "1H" which is equivalent to one period of the horizontal synchronization signal Hsync and the data enable signal DE), whereby the gate-on voltage Von is sequentially applied to all the image scanning lines $G_1$-$G_n$ and the image data voltages are applied to all the pixels PX to thus display an image of one frame.

When one frame is finished, a next frame is started and in one exemplary embodiment a state of the inversion signal RVS applied to the image data driver 500 is controlled ("frame inversion") so that the polarity of the data voltage applied to each pixel PX may be opposite to the polarity in the previous frame. In such an exemplary embodiment using an inversion signal RVS, the polarity of an image data voltage flowing through one image data line may be changed even within one frame according to the inversion signal RVS (e.g., row inversion or dot inversion), or the polarity of image data voltages applied to one pixel row may be different (e.g., column inversion or dot inversion).

The sense signal processor 800 converts sense data signals flowing through the sense data lines $SY_1$-$SY_N$ and $SX_1$-$SX_M$ to generate digital sense signals DSN corresponding to X-axis and Y-axis contact positions of the pressure sensing units SU connected with the sense data lines $SY_1$-$SY_N$ and $SX_1$-$SX_M$, and transfers the digital sense signals DSN to the contact determiner 700.

Upon receiving the digital sense signals DSN, the contact determiner 700 determines whether or not the pressure sensing units SU have been contacted and if so a contact position thereof. As mentioned above, the existence, and position, of a contact may be used to control an operation corresponding to a command or menu selected by a user.

One exemplary embodiment of the LCD having the pressure sensing unit according to the present invention will now be described in detail with reference to FIGS. 6-7B.

Figure 6:
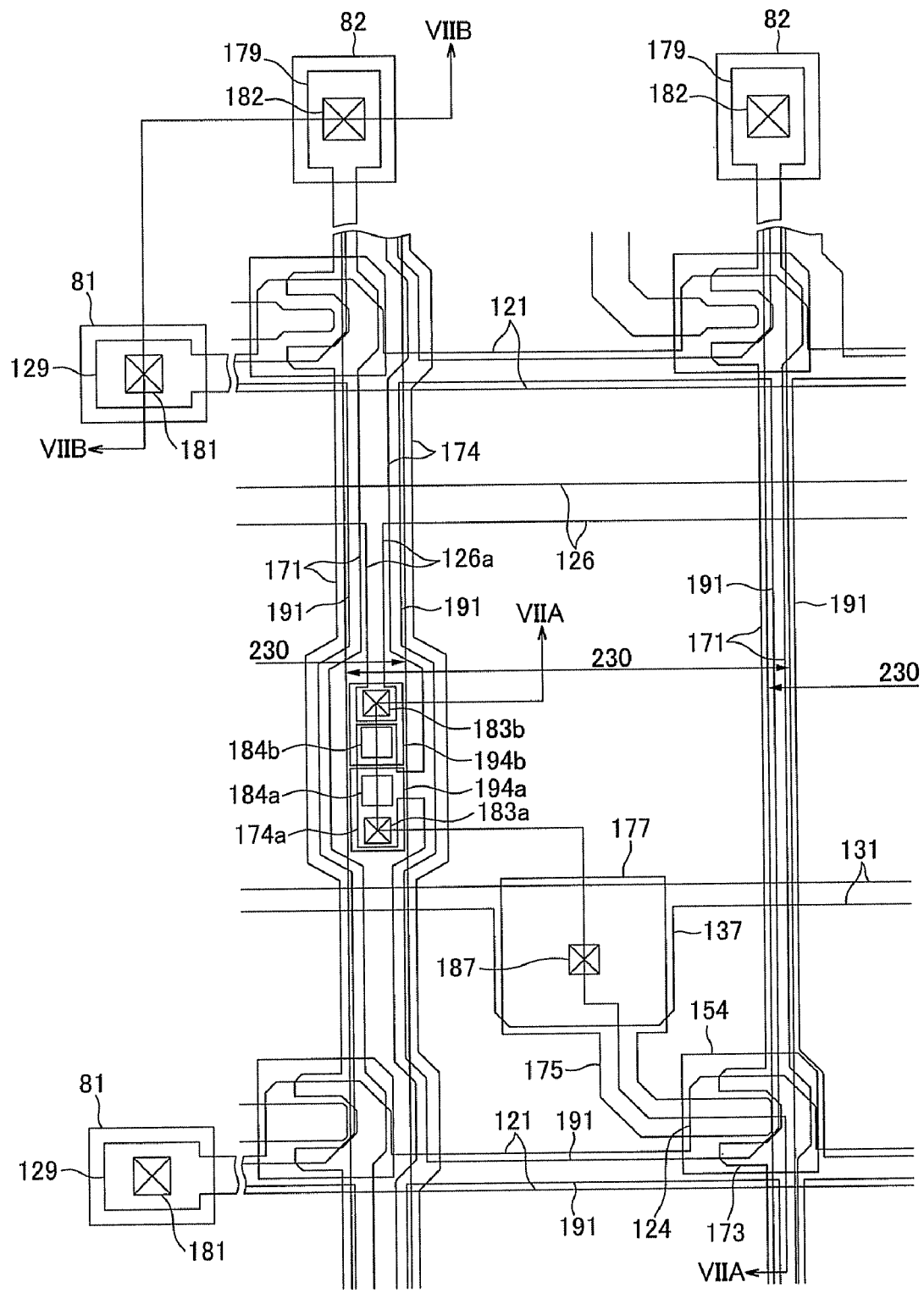
FIG. 6 is a top plan layout view of an exemplary embodiment of a thin film transistor ("TFT") array panel according to the present invention.
Figure 7A:
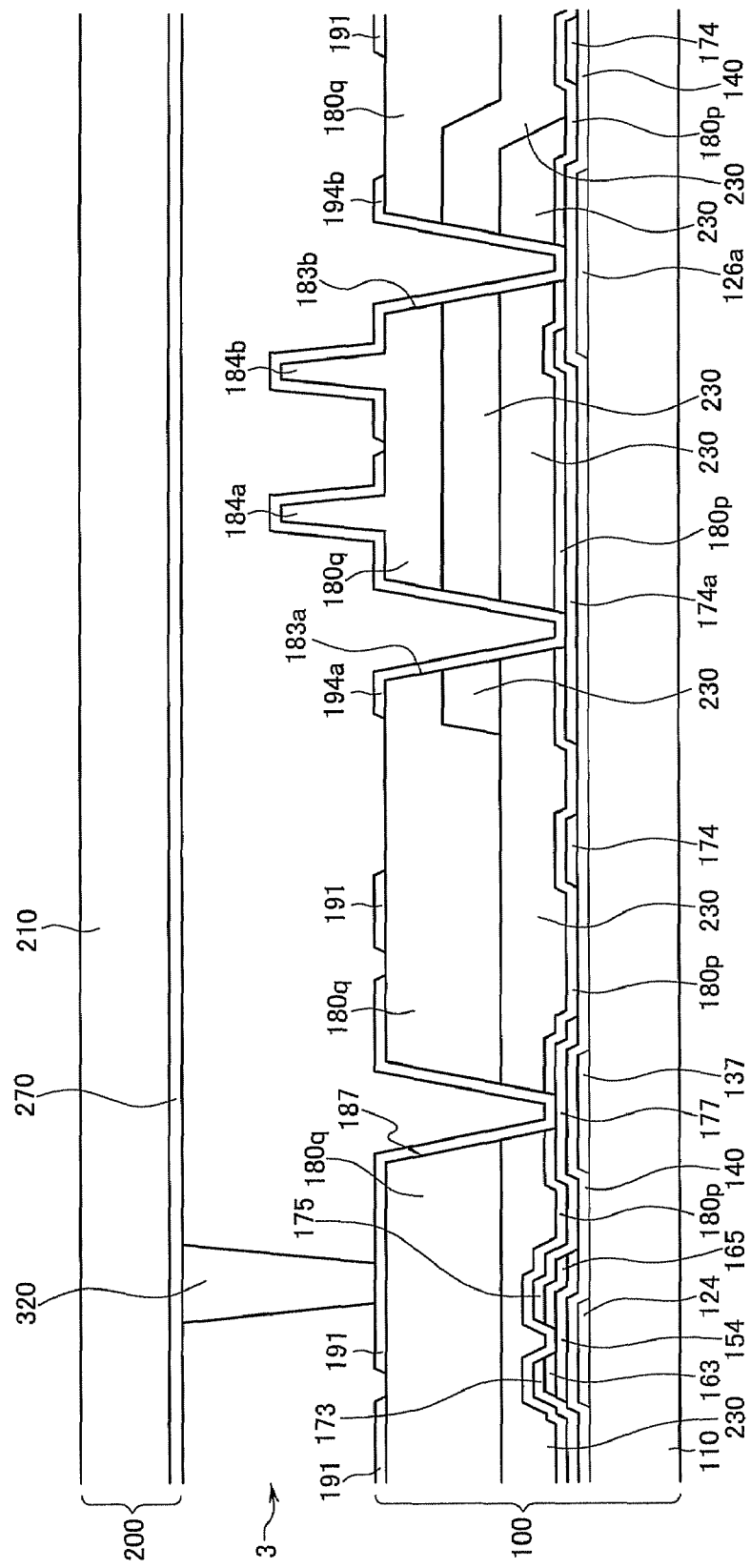
FIG. 7A is a cross-sectional view taken along line VIIA-VIIA of the exemplary embodiment of a TFT array panel in FIG. 6.
Figure 7B:
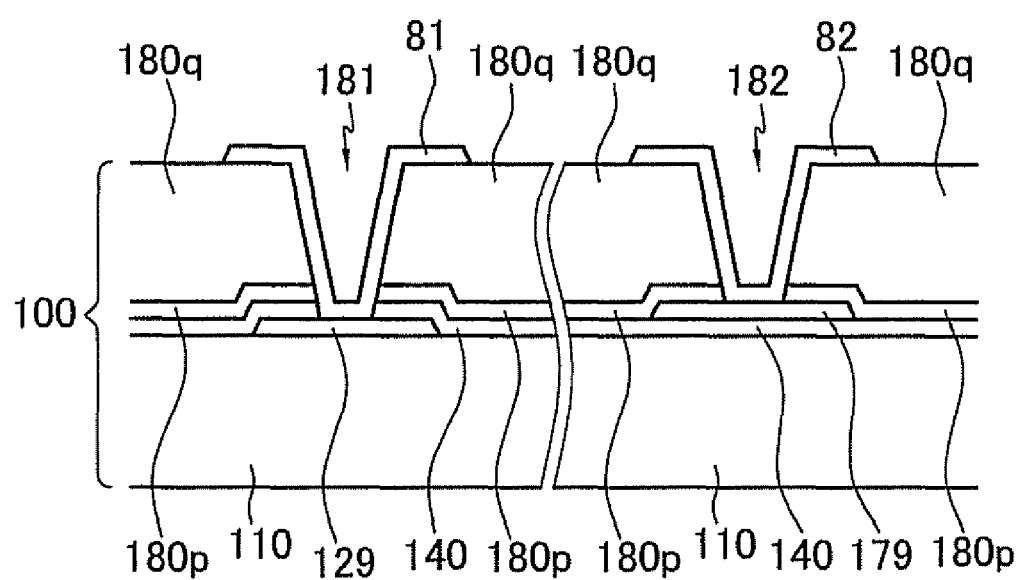
FIG. 7B is a cross-sectional view taken along line VIIB-VIIB of the exemplary embodiment of a TFT array panel in FIG. 6.

FIG. 6 is a top plan layout view of an exemplary embodiment of a TFT array panel according to the present invention, FIG. 7A is a cross-sectional view taken along line VIIA-VIIA of the exemplary embodiment of a TFT array panel in FIG. 6, and FIG. 7B is a cross-sectional view taken along line VIIB-VIIB of the exemplary embodiment of a TFT array panel in FIG. 6.

As mentioned above, the exemplary embodiment of an LCD according to the present invention includes the TFT array panel 100, the common electrode panel 200 which faces the TFT array panel 100, and the liquid crystal layer 3 interposed between the TFT array panel 100 and the common electrode panel 200.

The TFT array panel 100, which is the lower panel, is described below.

A plurality of image scanning lines 121, a plurality of horizontal sense data lines 126, and a plurality of storage electrode lines 131 are formed on an insulating substrate 110. Exemplary embodiments of the insulating substrate 110 are made of transparent glass or plastic.

The image scanning lines 121 transfer image scanning signals and extend substantially in a horizontal direction. Image scanning lines 121 include a plurality of gate electrodes 124 which protrude vertically upward towards a storage electrode line 131 and a large end portion 129 which connects with a different layer or an external driving circuit.

In one exemplary embodiment the gate electrode 124 has a chamfered portion. Image scanning driving circuits (not shown) for generating image scanning signals may be mounted on a flexible printed circuit film (not shown) attached on the substrate 110, directly mounted on the substrate 110, or integrated with the substrate 110. When the image scanning driving circuits is integrated with the substrate 110, the image scanning lines 121 may be elongated to be directly connected thereto and therefore the large end portion 129 may be omitted.

The horizontal sense data lines 126 transfer sense data signals and extend substantially in a horizontal direction. Each horizontal sense data line 126 extends a certain length in a vertical direction and includes an extended portion 126a including a portion with a large width. The extended portion 126a branches from the horizontal data lines 126. Each horizontal sense data line 126 may include an end portion with a larger area (not shown) for a connection with a different layer or an external driving circuit.

Each storage electrode line 131 is separated from the image scanning lines 121, and extends substantially in the horizontal direction, and includes a plurality of expanded portions 137 which are protruded vertically downward toward the image scanning line 121. A certain voltage is applied to the storage electrode lines 131, one exemplary embodiment of which is the common voltage applied to the common electrode 270 of the common electrode panel 200 of the LCD.

In one exemplary embodiment the image scanning lines 121, the horizontal sense data lines 126, and the storage electrode lines 131 may be made of an aluminum containing metal such as aluminum (A) or an aluminum alloy, a silver containing metal such as silver (Ag) or a silver alloy, a copper containing metal such as copper (Cu) or a copper alloy, a molybdenum containing metal such as molybdenum (Mo) or a molybdenum alloy, chromium (Cr), tantalum (Ta), titanium (Ti), or various other materials with similar characteristics. In an alternative exemplary embodiment the image scanning lines 121, the horizontal sense data lines 126, and the storage electrode lines 131 may have a multi-layered structure including two conductive layers (not shown) each having different physical properties. In such an alternative exemplary embodiment one of the conductive layers may be made of a metal with low resistivity, exemplary embodiments of which include the aluminum containing metal, the silver containing metal, the copper containing metal, or the other materials listed above, in order to reduce a signal delay or a voltage drop. The other conductive layer in such an alternative exemplary embodiment may be made of a material which has good physical, chemical, and electrical contact characteristics with other materials, particularly with indium tin oxide ("ITO") and indium zinc oxide ("IZO"), exemplary embodiments of which include an molybdenum-based metal, chromium, tantalum, titanium, or other materials with similar characteristics. Exemplary embodiments of such a combination may include a combination of a lower chromium layer and an upper aluminum (alloy) layer, and a combination of a lower aluminum (alloy) layer and an upper molybdenum (alloy) layer. In addition, the image scanning lines 121, the horizontal sense data lines 126, and the storage electrode lines 131 may be made of various other metals or conductors.

According to one exemplary embodiment the sides of the image scanning lines 121, the horizontal sense data lines 126, and the storage electrode lines 131 are sloped relative to the surface of the insulating substrate 110. in one exemplary embodiment the slope angle is about 30° to about 80°.

A gate insulating layer 140, exemplary embodiments of which may be made of silicon nitride ("SiNx") or silicon oxide ("SiOx"), or other materials with similar characteristics, is formed on the image scanning lines 121, the horizontal sense data lines 126, and the storage electrode lines 131.

A plurality of semiconductor islands 154 made of hydrogenated amorphous silicon ("a-Si") or polycrystalline silicon, or other substances with similar characteristics, are formed on the gate insulating layer 140. In the present exemplary embodiment the semiconductor islands 154 are positioned at an upper side of the gate electrodes 124.

A plurality of ohmic contact islands 163 and 165 are formed on the semiconductor islands 154. In one exemplary embodiment the ohmic contact islands 163 and 165 may be made of a material such as n+ hydrogenated amorphous silicon in which high density of an n-type impurity such as phosphor is doped, or in an alternative exemplary embodiment the ohmic contact islands 163 and 165 may be made of silicide. The ohmic contact islands 163 and 165 are disposed as a pair on the semiconductor islands 154.

In one exemplary embodiment the sides of the semiconductor islands 154 and the ohmic contact islands 163 and 165 are also sloped to the substrate 110, and the slope angle is about 30° to about 80°.

A plurality of image data lines 171, a plurality of drain electrodes 175, and a plurality of vertical sense data lines 174 are formed on the ohmic contact islands 163 and 165 and the gate insulating layer 140.

The image data lines 171 transfer image data signals and extend substantially in a vertical direction and cross the image scanning lines 121, but are not electrically connected thereto. Each image data line 171 includes a plurality of source electrodes 173 extending toward the gate electrodes 124 and a large end portion 179 for a connection with a different layer or an external driving circuit. Again, in the exemplary embodiment wherein connections are made directly with the driving apparatus the large end section 179 may be omitted. Image data driving circuits (not shown) may be mounted on the flexible printed circuit film (not shown) attached on the substrate 110, directly mounted on the substrate 110, or integrated with the substrate 110. When the image data driving circuits are integrated with the substrate 110, the image data lines 171 may be elongated to be directly connected thereto as mentioned above.

Each drain electrode 175 is separated from the image data line 171 and faces the source electrode 173 centering on the gate electrode 124. Each drain electrode 175 includes one large end portion including an expanded portion 177 and a separate narrow end portion opposing the expanded portion. The expanded portion 177 overlaps with the storage electrode line 131 and the narrow end portion is partially surrounded by the source electrode 173.

One gate electrode 124, one source electrode 173, and one drain electrode 175 together form a TFT with the semiconductor island 154, and a channel of the TFT is formed at the semiconductor island 154 between the source electrode 173 and the drain electrode 175.

The vertical sense data lines 174 transfer sense data signals and extend substantially in the vertical direction. In the present exemplary embodiment the vertical sense data lines 174 extend separately from the adjacent image data lines 171. Each vertical sense data line 174 includes an expanded portion 174a with a large width and may include an end portion (not shown) with a large area for a connection with a different layer or an external driving circuit.

In one exemplary embodiment the image data lines 171, the drain electrodes 175, and the vertical sense data lines 174 are made of a refractory metal such as molybdenum, chromium, tantalum, titanium, or other material with similar characteristics, or their alloys, and in one exemplary embodiment may have a multi-layered structure including a refractory metal layer as described above (not shown) and a low-resistance conductive layer as described above (not shown). Exemplary embodiments of the multi-layered structure may include a double-layered structure including a lower chromium or molybdenum (alloy) layer and an upper aluminum (alloy) layer, and a triple-layered structure including a lower molybdenum (alloy) layer, an intermediate aluminum (alloy) layer, and an upper molybdenum (alloy) layer. Also, the image data lines 171, the drain electrodes 175, and the vertical sense data lines 174 may be made of various other metals or conductors.

In one exemplary embodiment the sides of the image data line 171, the drain electrode 175, and the vertical sense data line 174 are sloped with respect to the surface of the substrate 110 at a slope angle of about 30° to about 80°.

The ohmic contact islands 163 and 165 are disposed between the lower semiconductor island 154 and the upper image data line 171 and the drain electrode 175, in order to lower contact resistance therebetween. Some portions of the semiconductor island 154 including a portion between the source electrode 173 and the drain electrode 175 are exposed without being covered by the image data line 171 and the drain electrode 175.

A lower passivation layer 180p is formed on the image data line 171 and the drain electrode 175, and on the exposed portion of the semiconductor island 154. In one exemplary embodiment the lower passivation layer 180p is made of an inorganic insulator such as silicon nitride or silicon oxide.

Color filters 230 in a stripe shape are formed on the lower passivation layer 180p. In one exemplary embodiment each color filter 230 includes one of the primary colors such as red, green, and blue. The color filters 230 are positioned between two adjacent image data lines 171. The neighboring color filters 230 overlap at an upper side of the image data lines 171 and the vertical sense data lines 174 to substantially prevent light leakage between pixel electrodes 191. The color filters 230 are not disposed in the peripheral area of the end portions 129 of the image scanning lines 121 and the end portions 179 of the image data lines 171. Additionally the color filters 230 include a plurality of openings positioned on the drain electrode 175. The openings expose a portion of each drain electrode 175 and the lower passivation layer 180p.

An edge portion of each color filter 230 may have a thickness smaller than that of other portions in order to obtain better step coverage characteristics of an upper layer and seek planarization of the TFT array panel 100 to thus prevent misalignment of liquid crystals. The color filters completely cover the image data lines 171 and the vertical sense data lines 174. Edges of the neighboring color filters 230 may be precisely conformed to each other so that the entire display region is covered by overlapping color filters 230.

An upper passivation layer 180q, exemplary embodiments of which are made of an organic insulating material, is formed on the color filters 230 and includes a plurality of sensing protrusions 184a and 184b. In one exemplary embodiment the organic insulating material has a dielectric constant of 4.0 or less, and may have photosensitivity and may form a planarized surface. In an alternative exemplary embodiment instead of the upper and lower passivation layers 180p and 180q, the passivation layer may have a single-layered structure made of an inorganic insulating material or the organic insulating material.

The expanded portion 174a is formed at a position corresponding to the plurality of sensing protrusions 184a and 184b to thus allow the bottoms of the plurality of sensing protrusions 184a and 184b to be maintained at the same level. In one exemplary embodiment contact gaps between the common electrode 270 and the vertical sense data lines 174 and contact gaps between the common electrode 270 and the horizontal sense data lines 126 are substantially similar.

A plurality of contact holes 187, 182, and 183a are formed at the upper and lower passivation layers 180q and 180p, exposing the expanded portions 177 of the drain electrodes 175, the end portions 179 of the image data lines 171, and the expanded portions 174a of the vertical sense data lines 126, and a plurality of contact holes 181 and 183b are also formed at the upper and lower passivation layers 180q and 180p, exposing the end portions 129 of the image scanning lines 121 and the expanded portions 126a of the horizontal sense data lines 126 together with the gate insulating layer 140. The contact holes 181, 182, 183a, 183b, and 187 have sloped sides, respectively. Accordingly, the lower passivation layer 180p and the upper passivation layer 180q have a corresponding geometry at the contact holes 181, 182, and 187. Also, a portion of an upper surface of the color filter 230 may be exposed to make the contact hole 187 have a stepped profile.

A plurality of pixel electrodes 191, a plurality of conductive members 194a and 194b, and a plurality of contact assistants 81 and 82 are formed on the passivation layers 180p and 180q. In one exemplary embodiment the pixel electrodes 191, the conductive members 194a and 194b, and the contact assistants 81 and 82 may be made of a transparent conductive material such as ITO or IZO, or of a reflective metal such as aluminum, silver, chromium, or alloys thereof.

The pixel electrode 191 is physically and electrically connected with the drain electrode 175 via the contact hole 187 and receives an image data voltage from the drain electrode 175. The pixel electrode 191, to which the image data voltage has been applied, generates an electric field together with the common electrode 270 of the common electrode panel 200, wherein the common electrode 270 receives the common voltage. The electric field determines a direction of orientation of the liquid crystal molecules (not shown) of the liquid crystal layer 3 between the two electrodes 191 and 270. Polarization of light which transmits through the liquid crystal layer 3 differs depending on the thusly determined direction of the liquid crystal molecules. The pixel electrode 191 and the common electrode 270 form the liquid crystal capacitor Clc, described above with reference to FIGS. 1-3, to sustain the applied voltage even after the TFT is turned off.

The pixel electrode 191 and the drain electrode 175 connected with the pixel electrode 191 overlap the storage electrode line 131. The pixel electrode 191 and the drain electrode 175 electrically connected thereto overlap with the storage electrode line 131 to form the storage capacitor Cst, as described above with reference to FIGS. 1-3, which strengthens the voltage storage capability of the liquid crystal capacitor.

The pixel electrode 191 may overlap with the neighboring image scanning line 121 and the image data line 171 to increase the aperture ratio of the pixel PX.

The conductive member 194a and 194b are formed on the sensing protrusions 184a and 184b, respectively.

The contact assistants 81 and 82 are connected with the end portions 129 of the image scanning lines 121 and the end portions 179 of the image data line 171 through the contact holes 181 and 182, respectively. The contact assistants 81 and 82 enhance the adhesion between the end portions 129 and 170 and external devices, and protect the end portions 129 and 179 from damage such as corrosion, scratching, or other defects.

A transparent conductive organic film, or other similar substance, may be used the pixel electrode 191 and the conductive members 184a and 184b, and in of the exemplary embodiment wherein the LCD is a reflective LCD, an opaque reflective metal may be used. In such an exemplary embodiment, the contact assistants 81 and 82 may be made of a different material from the pixel electrodes 191, including IZO or ITO.

The structure of the common electrode panel 200 will be described below.

The common electrode 270 is formed on an insulating substrate 210, exemplary embodiments of which are made of transparent glass or plastic. In one exemplary embodiment the common electrode 270 is made of a transparent conductor such as ITO or IZO. The common voltage Vcom is applied to the common electrode 270.

A plurality of spacers 320, exemplary embodiments of which are column shaped and made of an organic material, are formed on the common electrode 270. In an alternative exemplary embodiment the spacers 320 may be made on the pixel electrode 191 of the TFT array panel 100.

The columnar spacers 320 are formed between the pixels PX or within each pixel PX, and are uniformly dispersed on the liquid crystal panel assembly 300. The columnar spacers 320 maintain a gap between the TFT array panel 100 and the common electrode panel 200 and are higher than the sensing protrusions 184a and 184b of the TFT array panel 100.

Although not shown, one exemplary embodiment includes a light blocking member, also called a black matrix, formed at a lower portion of the common electrode 270. The light blocking member has openings at portions corresponding to pixels PX surrounded by the image scanning lines 121 and the image data lines 171, and is made of an organic material including a black pigment which blocks light which may leak between neighboring pixels PX. In such an exemplary embodiment, an overcoat made of an insulating material, exemplary embodiments of which include organic material, may be formed on the insulating substrate 210 with the light blocking member formed thereon.

An alignment layer (not shown) for aligning the liquid crystal layer 3 is coated on each inner surface of the panels 100 and 200, and one or more polarizers (not shown) are provided on each outer surface of the panels 100 and 200.

In one exemplary embodiment the LCD may further include a sealant (not shown) binding the TFT array panel 100 and the common electrode panel 200. The sealant is positioned on an edge portion of the common electrode panel 200.

The liquid crystal layer 3 is interposed between the TFT array panel 100 and the common electrode panel 200, and because the two panels 100 and 200 are supported by the columnar spacers 320, a certain gap is sustained between the conductive members 194a and 194b which cover the sensing protrusions 184a and 184b and the common electrode 270. In one exemplary embodiment the gap is about 0.001 μm or greater.

In an alternative exemplary embodiment the gap between the two panels 100 and 200 may be supported by bead spacers (not shown) instead of, or in addition to, the columnar spacers 320.

The common electrode 270 and the conductive members 194a and 194b covering the sensing protrusions 184a and 184b form a switch SWT of the pressure sensing unit. Thus, when the common electrode panel 200 is compressed towards the TFT array panel 100 by a contact, such as that caused by a finger of a user, the common electrode 270 of the common electrode panel 200 is electrically and physically connected with the conductive members 194a and 194b covering the sensing protrusions 184a and 184b, respectively, of the TFT array panel 100 at the point of contact. Accordingly, the common voltage Vcom is transferred to the conductive members 194a and 194b so as to conduct a sense data signal to the corresponding horizontal or vertical sense data lines 126 and 174 through the corresponding contact holes 183a and 183b.

The process of making the contact between the common electrode 270 and the sensing protrusions 184a and 184b becomes easier when the common electrode panel 200 is made to be thin. In one exemplary embodiment the thickness of the common electrode panel 200 is about 0.1 mm to about 1 mm.

As described above, the vertical sense data lines 174 where the switch SWT of the pressure sensing unit is formed are formed between adjacent pixels PX at every one of a certain number of dot columns. Virtual vertical sense data lines (not shown), which are similar to the vertical sense data lines except that no switch is formed therein, are formed between dots where the vertical sense data lines 174 are not formed to maintain a substantially constant gap between dots.

Also, as described above, the horizontal sense data lines 126 where the switches SWT of the pressure sensing units are formed are formed at every certain number of dot rows, and virtual horizontal sense data lines (not shown), which are similar to the horizontal sense data lines except that no switches are formed therein, are formed at pixel rows where the horizontal sense data lines 126 are not formed.

By forming such virtual vertical and horizontal sense data lines, a defect of vertical line or horizontal line pattern caused by a difference of capacitance can be reduced.

Another exemplary embodiment of the LCD having the pressure sensing units according to the present invention will now be described in detail.

Figure 8:
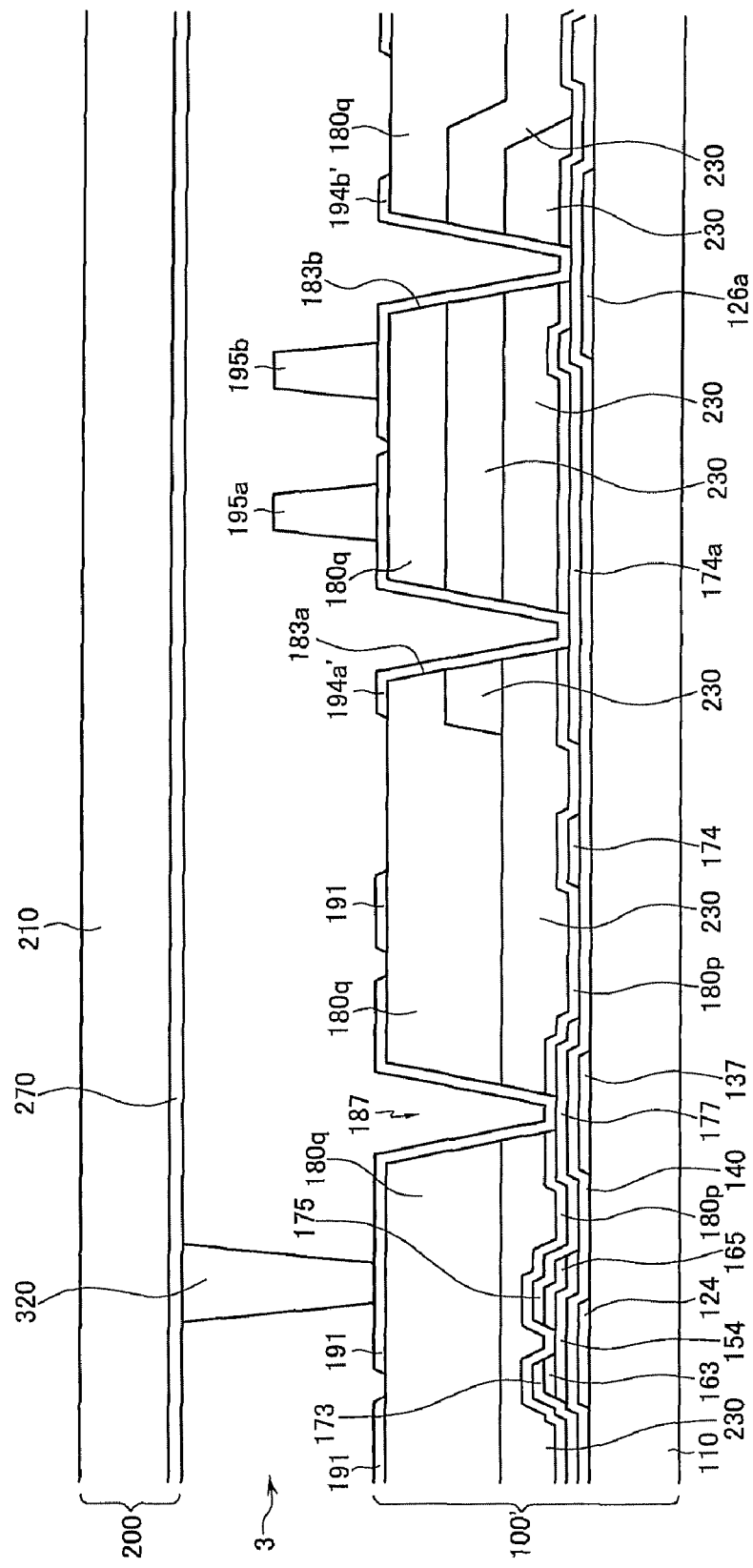
FIG. 8 is another exemplary embodiment of a cross-sectional view taken along line VIIA-VIIA of the TFT array panel in FIG. 6.

FIG. 8 is another exemplary embodiment of a cross-sectional view taken along line VIIA-VIIAa of the TFT array panel in FIG. 6.

The layered structure of the LCD as shown in FIG. 8 is substantially the same as that shown in FIG. 7.

In the exemplary embodiment of a TFT array panel 100', a plurality of horizontal sense data lines 126 including a plurality of image scanning lines 121 and extended portions 126b are formed on the substrate 110, on which a gate insulating layer 140, a plurality of semiconductor islands 154, and a plurality of ohmic contact islands 163 and 165 are sequentially formed. On the ohmic contact islands 163 and 165 and the gate insulating layer 140, there are formed a plurality of image data lines 171 including a plurality of source electrodes 173 and a plurality of vertical sense data lines 174 including a plurality of drain electrodes 175 and a plurality of expanded portions 174b, on which a lower passivation layer 180p is formed.

Color filters 230 are formed on the lower passivation layer 180p, and an upper passivation layer 180q is formed on the color filters 230.

A plurality of contact holes 181, 182, 183a, 183b, and 187 are formed on the passivation layers 180p and 180q or the gate insulating layer 140, and a plurality of pixel electrodes 191 and a plurality of contact assistants 81 and 82 are formed on the passivation layer 180q.

Unlike the TFT array panel 100 of the LCD as shown in FIG. 7 in which the sensing protrusions 184a and 184b are formed on the upper passivation layer 180q, the TFT array panel 100' of the LCD as shown in FIG. 8 is formed such that a plurality of conductive members 194a' and 194b' are formed on the upper passivation layer 180q along with the pixel electrodes 191, and sensing protrusions 195a and 195b are formed on the conductive members 194a' and 194b'.

According to this alternative exemplary embodiment the sensing protrusions 195a and 195b may be made of a transparent conductive material, exemplary embodiments of which include a transparent conductive organic film such as polypyrrole, polyphenylene, and polyanilline. However, alternative exemplary embodiments include configurations wherein the sensing protrusions 195a and 195b may be made of an opaque conductive material. In such an exemplary embodiment, the sensing protrusions 194a and 195b are formed between pixels PX so as not to affect the aperture ratio of the pixels PX.

In the TFT array panel 100' as shown in FIG. 8, the upper passivation layer 180q is formed on the color filters 230 to protect the color filters 230, and alternative exemplary embodiments include configurations wherein the upper passivation layer 180q may be omitted.

A common electrode panel 200 as shown in FIG. 8 has substantially the same layered structure as that of shown in FIG. 7. Namely, a common electrode 270 is formed on the insulating substrate 210, and columnar spaces 320 are formed on the common electrode 270.

Because the two panels 100 and 200 are supported by the plurality of columnar spacers 320, a certain gap is sustained between the sensing protrusions 195a and 195b and the common electrode 270. Again, in one exemplary embodiment the gap is about 0.001 μm.

In one exemplary embodiment of the present invention, the method of manufacturing the above described exemplary embodiment of a TFT array panel 100' uses five sheets of masks. However the present invention may also be applied to structures which use three or four sheets of masks in the manufacturing method thereof.

Pressure sensing units are used as sensing units in the above-described exemplary embodiments of the present invention, however the present invention is not limited thereto and sensing units which use variable capacitors with a capacitance which changes depending on pressure applied from an external source or optical sensors whose output signals change according to intensity of light received thereby may alternatively also be used. In yet another alternative exemplary embodiment the exemplary embodiment of a display device of the present invention can improve the accuracy of contact determination by including two or more types of sensing units.

The present invention has been described with reference to exemplary embodiments wherein the display device is an LCD, however the present invention may also be applied in the same manner for a plasma display device or an organic light emitting display, or various other types of display devices.

In the above-described exemplary embodiment of the present invention, the sensing units for sensing contact is installed within the display device and therefore the thickness and volume of the display device can be reduced, the fabrication process is simplified, and the fabrication cost can also be reduced.

In addition, because the sensing protrusions are not formed on the common electrode panel, which is the upper panel which would be compressed by an external pressure, but on the TFT array panel, durability of the sensing protrusions can be enhanced. The sensing protrusions are protected from the flexing forces applied to the common electrode panel and therefore may have increased lifetimes.

Moreover, because the color filters are formed on the TFT array panel with the TFTs formed thereon, misalignment between color filters and pixel electrodes which are formed on different panel can be reduced.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A thin film transistor array panel comprising:
a plurality of thin film transistors disposed on a substrate each thin film transistor including a gate electrode, a source electrode, and a drain electrode;
a first passivation layer disposed on the source and drain electrodes, and including a first contact hole exposing at least a portion of the drain electrode;
a second passivation layer disposed on the first passivation layer, and including at least one sensing protrusion and a second contact hole;
pixel electrodes disposed on the second passivation layer connected with the drain electrode through the first and second contact holes; and
at least one conductive member disposed on the sensing protrusion,
wherein an upper surface of the sensing protrusion is higher than a surface of the second passivation layer.

2. The thin film transistor array panel of claim 1, wherein the conductive member comprises substantially the same material as the pixel electrodes.

3. The thin film transistor array panel of claim 2, wherein the conductive member comprises indium tin oxide or indium zinc oxide.

4. The thin film transistor array panel of claim 2, wherein the conductive member comprises a transparent conductive organic film.

5. The thin film transistor array panel of claim 2, wherein the conductive member is disposed on the same layer on which the pixel electrode is disposed.

6. The thin film transistor array panel of claim 2, wherein the second passivation layer comprises an organic insulator.

7. The thin film transistor array panel of claim 1, further comprising color filters disposed on the first passivation layer.

8. A thin film transistor array panel comprising:
a plurality of thin film transistors disposed on a substrate and each including a gate electrode, a source electrode, and a drain electrode;
a first passivation layer disposed on the source and drain electrodes, and having a first contact hole exposing at least a portion of the drain electrode;
a second passivation layer disposed on the first passivation layer;
pixel electrodes disposed on the first passivation layer and connected with the drain electrode through the first contact hole;
at least one conductive member disposed on the first passivation layer; and
at least one sensing protrusion disposed on the conductive member,
wherein an upper surface of the sensing protrusion is higher than a surface of the second passivation layer.

9. The thin film transistor array panel of claim 8, wherein the second passivation layer has a second contact hole corresponding to the first contact hole.

10. The thin film transistor array panel of claim 8, wherein the conductive member comprises substantially the same material as the pixel electrode.

11. The thin film transistor array panel of claim 10, wherein the conductive member is made of indium tin oxide or indium zinc oxide.

12. The thin film transistor array panel of claim 8, wherein the conductive member comprises a transparent conductive organic film.

13. The thin film transistor array panel of claim 8, wherein the conductive member is disposed on the same layer on which the pixel electrode is disposed.

14. The thin film transistor array panel of claim 8, wherein the sensing protrusion comprises a transparent conductive organic film.

15. The thin film transistor array panel of claim 8, further comprising color filters disposed on the first passivation layer.

16. A display device comprising:
   a first display panel including a common electrode disposed thereon; and
   a second display panel comprising:
      a plurality of thin film transistors each including a gate electrode, a source electrode, and a drain electrode;
      a first passivation layer disposed on the source and drain electrodes;
      a second passivation layer disposed on the first passivation layer and including at least one sensing protrusion;
      pixel electrodes disposed on the second passivation layer and connected with the drain electrode; and
      at least one conductive member disposed on the sensing protrusion,
      wherein an upper surface of the sensing protrusion is higher than a surface of the second passivation layer.

17. The display device of claim 16, wherein the conductive member comprises substantially the same material as the pixel electrode.

18. The display device of claim 17, wherein the conductive member comprises a transparent conductive organic film.

19. The display device of claim 16, wherein the conductive member is disposed on the same layer on which the pixel electrode is disposed.

20. The display device of claim 16, wherein the second passivation layer comprises an organic insulator.

21. The display device of claim 16, wherein the first display panel further comprises spacers disposed on the common electrode.

22. The display device of claim 21, wherein a height of the sensing protrusion is lower than a height of the spacers.

23. The display device of claim 16, wherein the second display panel further comprises color filters disposed on the first passivation layer.

24. A display device comprising:
   a first display panel including a common electrode disposed thereon; and
   a second display panel comprising:
      a plurality of thin film transistors each including a gate electrode, a source electrode, and a drain electrode;
      a first passivation layer disposed on the source and drain electrodes;
      a second passivation layer disposed on the first passivation layer;
      pixel electrodes disposed on the first passivation layer and connected with the drain electrode;
      at least one conductive member disposed on the first passivation layer; and
      at least one sensing protrusion disposed on the conductive member,
      wherein an upper surface of the sensing protrusion is higher than a surface of the second passivation layer.

25. The display device of claim 24, further comprising a second passivation layer disposed on the first passivation layer.

26. The display device of claim 24, wherein the conductive member comprises the same material as the pixel electrode.

27. The display device of claim 24, wherein the conductive member is disposed on the same layer on which the pixel electrode is disposed.

28. The display device of claim 24, wherein the sensing protrusion comprises a transparent conductive organic film.

29. The display device of claim 24, wherein the first display panel further comprises spacers disposed on the common electrode.

30. The display device of claim 29, wherein a height of the sensing protrusion is lower than a height of the spacers.

31. The display device of claim 24, wherein the second display panel further comprises color filters disposed on the first passivation layer.

32. A method of manufacturing a thin film transistor array panel, the method comprising:
   disposing a plurality of thin film transistors on a substrate, each thin film transistor including a gate electrode, a source electrode, and a drain electrode;
   disposing a first passivation layer on the source and drain electrodes, wherein the first passivation layer includes a first contact hole exposing at least a portion of the drain electrode;
   disposing a second passivation layer on the first passivation layer, wherein the second passivation layer includes at least one sensing protrusion and a second contact hole;
   disposing pixel electrodes on the second passivation layer, wherein the pixel electrodes are connected with the drain electrode through the first and second contact holes; and
   disposing at least one conductive member on the sensing protrusion,
   wherein an upper surface of the sensing protrusion is higher than a surface of the second passivation layer.

* * * * *